(12) United States Patent
Ahn et al.

(10) Patent No.: US 9,378,986 B2
(45) Date of Patent: Jun. 28, 2016

(54) METHOD FOR MOUNTING A CHIP AND CHIP PACKAGE

(71) Applicant: Point Engineering Co., Ltd., Asan-si (KR)

(72) Inventors: Bum Mo Ahn, Yongin-si (KR); Ki Myung Nam, Cheonan-si (KR); Seung Ho Park, Hwaseong-si (KR)

(73) Assignee: Point Engineering Co., Inc., Asan-si (KR)

( * ) Notice: Subject to any disclaimer, the term of this patent is extended or adjusted under 35 U.S.C. 154(b) by 0 days.

(21) Appl. No.: 14/511,353

(22) Filed: Oct. 10, 2014

(65) Prior Publication Data

US 2015/0102486 A1 Apr. 16, 2015

(30) Foreign Application Priority Data

Oct. 10, 2013 (KR) .................... 10-2013-0120591

(51) Int. Cl.
*H01L 23/495* (2006.01)
*H01L 21/56* (2006.01)
(Continued)

(52) U.S. Cl.
CPC .......... *H01L 21/563* (2013.01); *H01L 21/4825* (2013.01); *H01L 23/4952* (2013.01);
(Continued)

(58) Field of Classification Search
CPC ............. H01L 21/563; H01L 21/4825; H01L 23/49513; H01L 23/49568; H01L 24/92; H01L 23/4952; H01L 24/11; H01L 23/49541; H01L 2224/1183; H01L 24/81; H01L 23/49816; H01L 2224/73253
USPC .................................... 257/98–100, 778, 783
See application file for complete search history.

(56) References Cited

U.S. PATENT DOCUMENTS 5,729,432 A * 3/1998 Shim ....................... H01L 23/13
                                                          165/80.3
6,429,043 B1    8/2002 Nakazawa et al. ............ 438/106
(Continued)

FOREIGN PATENT DOCUMENTS

JP        8-18104    * 1/1996 ............. H01L 33/00
JP        3314757      8/2002 ............. H01L 23/12
(Continued)

OTHER PUBLICATIONS

Korean Patent Office, Office Action regarding Korean Patent Application No. 10-2013-0120591, issued Sep. 25, 2014, 3 pages.

*Primary Examiner* — Jasmine Clark
(74) *Attorney, Agent, or Firm* — Sunstein Kann Murphy & Timbers LLP (57) ABSTRACT

Provided is a method of mounting a chip. The method includes: forming a bump at one surface of a cavity formed concavely in an inner direction of a substrate; performing a coining process to flatten a surface of the bump; coating a solder material on the bump subjected to the coining process; and bonding a chip and the bump by melting the solder material, wherein an electrode portion or a metal portion is formed on a bottom of the chip. For a metal substrate according to the present invention, wherein a vertical insulating layer is included, since the electrode portion of the chip and the electrode portion of the substrate have to be electrically connected, the metal substrate is bonded to the electrode portion of the chip using the bump additionally formed on the metal substrate, so the heat generated in the chip can be rapidly transferred to the substrate, and the junction temperature of the chip can be decreased, thereby enhancing the light efficiency and the. In addition, cracking due to the difference of thermal expansion coefficient between solder materials can be prevented by sealing the bonding portion of the chip using the solder materials. Further, since oxidation of the bonding portion is prevented by blocking the contact with the outside, the chip packaging process can be performed without an additional process of filling an inert gas into the internal space wherein the chip is mounted.

3 Claims, 7 Drawing Sheets

(51) Int. Cl.
*H01L 23/00* (2006.01)
*H01L 21/48* (2006.01)

(52) U.S. Cl.
CPC .......... *H01L23/49513* (2013.01); *H01L 24/11* (2013.01); *H01L 24/83* (2013.01); *H01L 24/92* (2013.01); *H01L 2224/1134* (2013.01); *H01L 2224/1183* (2013.01); *H01L 2224/13144* (2013.01); *H01L 2224/291* (2013.01); *H01L 2224/32013* (2013.01); *H01L 2224/32227* (2013.01); *H01L 2224/73265* (2013.01); *H01L 2224/83192* (2013.01); *H01L 2224/83385* (2013.01); *H01L 2224/83815* (2013.01); *H01L 2224/92227* (2013.01); *H01L 2924/12041* (2013.01); *H01L 2924/15156* (2013.01); *H01L 2924/15787* (2013.01); *H01L 2924/351* (2013.01)

(56) References Cited

U.S. PATENT DOCUMENTS 6,638,847 B1 * 10/2003 Cheung ................ B23K 35/001
257/738
2010/0200882 A1 * 8/2010 Kotani ............... C08G 59/3245
257/98

FOREIGN PATENT DOCUMENTS

JP    2003-303999   * 10/2003  .............. H01L 33/00
JP    2011-192845      9/2011  .............. H01L 33/48

* cited by examiner

METHOD FOR MOUNTING A CHIP AND CHIP PACKAGE

BACKGROUND

1. Technical Field

The present invention relates to a method of mounting a chip, and more particularly, to a chip mounting method capable of improving heat dissipation performance.

2. Description of the Related Art

Conventionally, when a chip is disposed in a light emitting diode (LED) package, a silver (Ag) paste, in which silver powder and epoxy are combined, has been used for bonding with a substrate and heat dissipation as well as electrical coupling. However, thermal conductivity of the current silver epoxy paste is about 10 to 30 W/mK at most, and there is a problem in that as the heat dissipation characteristic improves, the cost of such bonding materials is increased while the bonding strength thereof is decreased. According to a recent trend of using finer powders and miniaturization in LED packages, since much heat is generated from the chip, it is necessary to improve heat dissipation characteristics inside the package to prevent decline of both efficiency and lifespan of an LED.

In addition, when a ceramic substrate is used as a substrate of an LED package, since the heat dissipation characteristic of the bonding material is worse than that of the substrate, there is a problem in that overall heat dissipation efficiency of the LED package is decreased since a heat resistance in the bonding material is great even when the heat dissipation characteristic of the substrate is improved.

Accordingly, since the poor heat dissipation characteristic of the bonding material is a main factor which degrades the efficiency, the lifespan, and the performance of the chip, the chip bonding processes and the bonding materials are in need of improvements and developments.

SUMMARY

The present invention is directed to a bonding method using a bonding material with excellent heat dissipation performance. More particularly, the present invention is directed to a method of bonding a chip using a metal with excellent heat dissipation performance, and a chip structure.

In order to solve the above problems, an example of the present invention provides a method of mounting a chip, including: forming a bump at one surface of a cavity formed concavely in an inner direction of a substrate; performing a coining process to flatten a surface of the bump; coating a solder material on the bump subjected to the coining process; and bonding a chip and the bump by melting the solder material, wherein an electrode portion or a metal portion is formed on a bottom of the chip.

It is preferable that the step of bonding the chip includes sealing a space between the chip and the substrate by using the solder material, the space being formed by bonding the chip and the bump.

It is preferable that the method further includes plating a surface of the substrate before the step of forming the bump, wherein the bump is formed at one surface of the plated substrate in the step of forming the bump.

It is preferable that, in the step of forming the bump, the bump is formed at one surface of the cavity of the substrate isolated by an insulating portion configured to electrically isolate a conductive portion of the substrate.

It is preferable that the method further includes bonding a wire so as to electrically connect the chip and another surface of the cavity different from the one surface of the cavity whereon the bump is formed.

It is preferable that, in the step of forming the bump, a plurality of bumps are formed with intervals determined based on heat dissipation characteristics of the bump.

It is preferable that the method further includes sealing the cavity using a sealing member for sealing the chip disposed in the cavity.

In order to solve the above problems, an example of the present invention provides a chip package, including: a substrate including a cavity formed concavely in an inner direction; a chip wherein an electrode portion or a metal portion is formed on a bottom of the chip; a bump formed at one surface of the substrate whereon the cavity is formed; and a solder for bonding the chip and the bump by being melted, and sealing a space between the chip and the substrate formed by bonding the chip and the bump.

It is preferable that the substrate further includes a plating layer formed on a surface thereof, and the bump is formed on the plated surface of the substrate.

It is preferable that the bump is formed at one surface of the cavity of the substrate isolated by an insulating portion configured to electrically isolate a conductive portion of the substrate.

It is preferable that the method further includes a wire configured to electrically connect the chip and another surface of the cavity different from the one surface of the cavity whereon the bump is formed.

It is preferable that the chip package includes a plurality of bumps formed with intervals determined based on heat dissipation characteristics of the bump.

It is preferable that the method further includes a sealing member for sealing the chip disposed in the cavity.

DETAILED DESCRIPTION OF EMBODIMENTS

The following contents merely describes the illustrative examples of the principles of the invention. Although not clearly described and not shown in this specification, those of ordinary skill in the art may implement principles of the present invention and invent various devices included in the scope and spirit of the present invention. Further, all conditional terms and exemplary embodiments clearly described in this specification are intended only for the purpose of allowing the spirit of the present invention to be understood, and it should be understood that the present invention is not limited to the exemplary embodiments and states which are specially described herein.

The above-described objects, features and advantages will be more apparent from the accompanying drawings and the following description, and those of ordinary skill in the art may embody and practice the spirit of the present invention.

Further, when it is determined that detailed description of known technology related to the present invention unnecessarily obscures the gist of the present invention, detailed description thereof will be omitted. Hereinafter, exemplary embodiments of a substrate for mounting a chip will be described in detail with reference to the accompanying drawings, and for convenience, an example in which the chip is an ultraviolet (UV) chip will be described.

Figure 1:
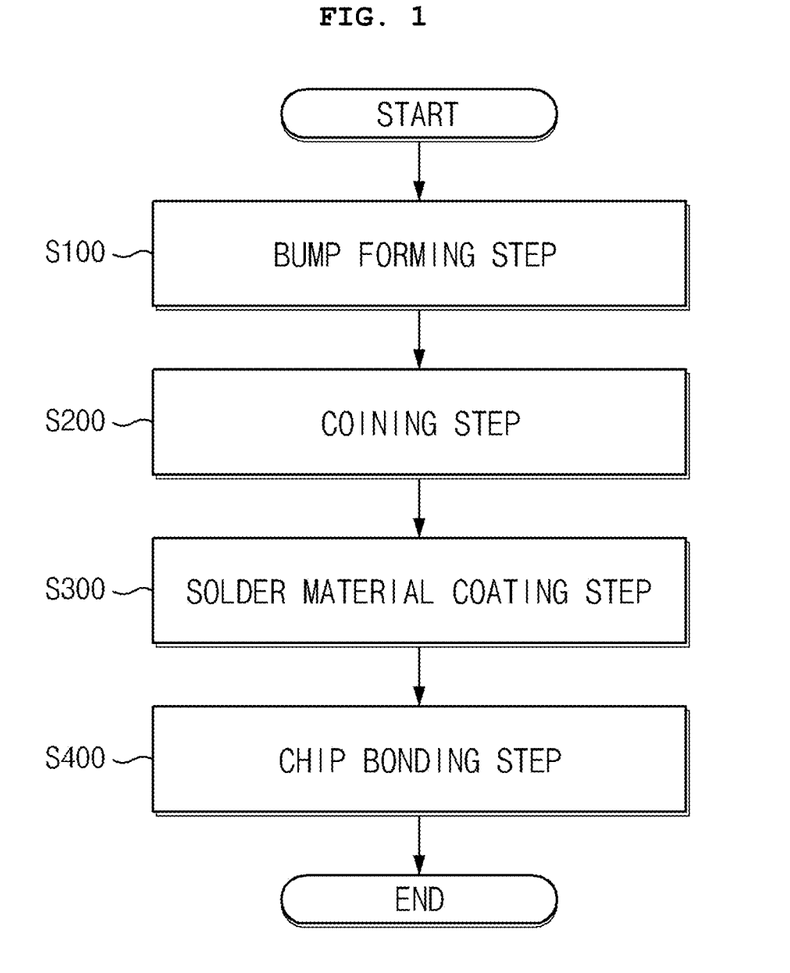
FIG. 1 is a flowchart for describing a chip mounting method according to an embodiment of the present invention.

FIG. 1 is a flowchart for describing a chip mounting method according to an embodiment of the present invention. Referring to FIG. 1, the chip mounting method according to an embodiment of the present invention may include a bump forming step (S100), a coining step (S200), a solder material coating step (S300), and a chip bonding step (S400).

In this embodiment, the bump forming step (S100) may include forming a bump in one surface of a cavity which is formed concavely in an inner direction of a substrate. That is, referring to FIG. 2a, the bump may be formed on one surface of the substrate, and more particularly, on one surface of a conductive portion 110 which is electrically isolated by an insulating portion 120.

Figure 2A:
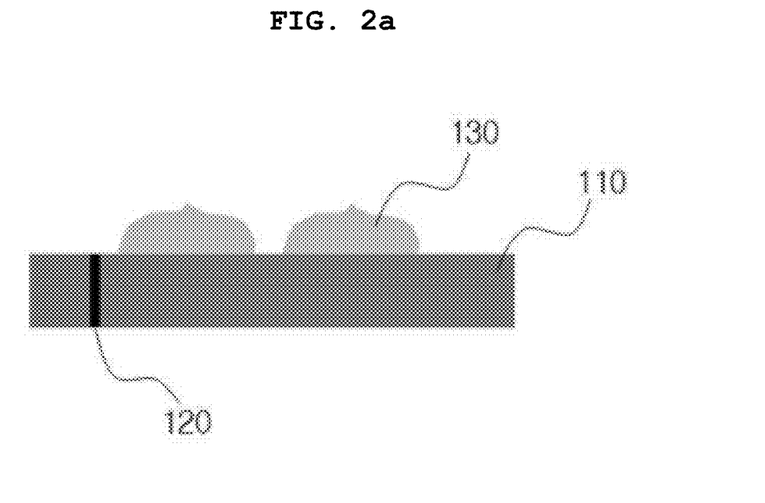
FIGS. 2a to 2d are diagrams sequentially illustrating a chip mounting process according to an embodiment of the present invention.

As shown in FIG. 2a, two gold stud bumps 130 may be formed on one surface of the isolated conductive portion 110. In this embodiment, the bumps 130 may transfer heat generated from a chip to the substrate, and preferably may adjust the density and the interval between the gold stud bumps 130 in consideration of heat dissipation characteristics.

Figure 2B:
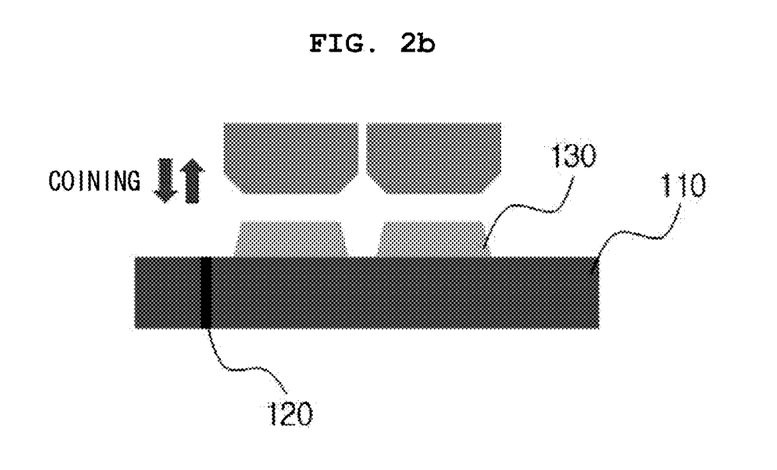

Next, the coining step (S200) may perform coining process in order to flatten the surfaces of the bumps 130. That is, referring to FIG. 2b, the coining process may be performed in order to flatten the surfaces of the two gold stud bumps 130, and the surfaces of the two gold stud bumps 130 may be bonded to an electrode portion 210 formed on the bottom of the chip through a solder material 150.

Figure 2C:
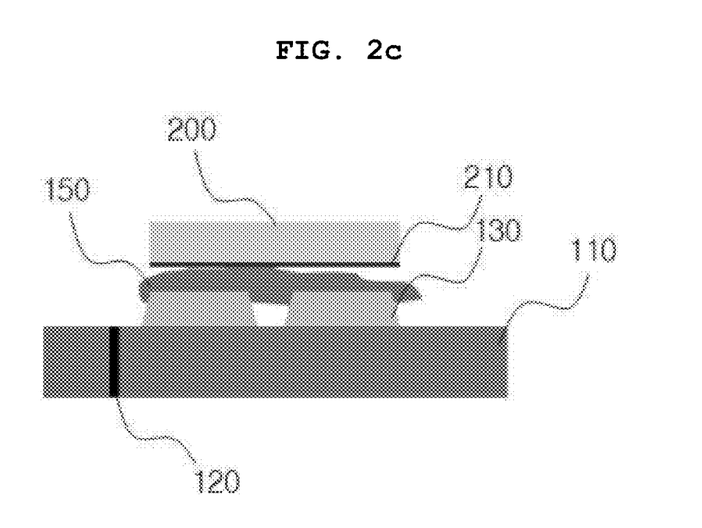

The solder material coating step (S300) may coat the solder material 150 on the surfaces of the bumps 130 flattened by the coining. Referring to FIG. 2c, in this embodiment, a solder cream may be applied on the surfaces of the bumps 130 flattened by the coining. As shown in FIG. 2c, the solder cream may be placed on the surfaces of the bumps 130.

Figure 2D:
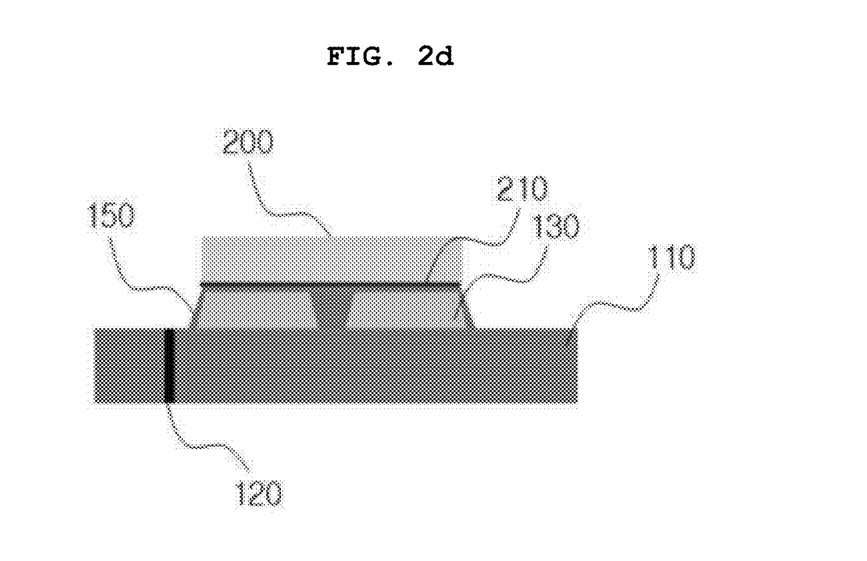

Next, the chip bonding step (S400) may perform bonding the bump 130 and the chip in which the electrode portion 210 or a metal portion is formed on the bottom by melting the solder material 150. Referring to FIG. 2d, in this embodiment, the solder cream 150 may be melted through a soldering process, may fill a space between the gold stud bumps 130 and the space formed through the bonding of the chip and the substrate, and thus may seal a bond portion of the chip in a trapezoidal shape in general.

In addition, in this embodiment, the chip mounting method may further include a process for bonding the chip and a wire for electrically connecting the portion other than the surface of the cavity in which the bumps 130 are formed in order to apply a voltage of the other polarity after the chip is mounted on the substrate. In this embodiment, positions for forming the bumps 130, wire bonding methods, and the like may be varied according to the structure of the chip such as a flip chip which is an example in the chip mounting method or a vertical type chip.

Figure 3:
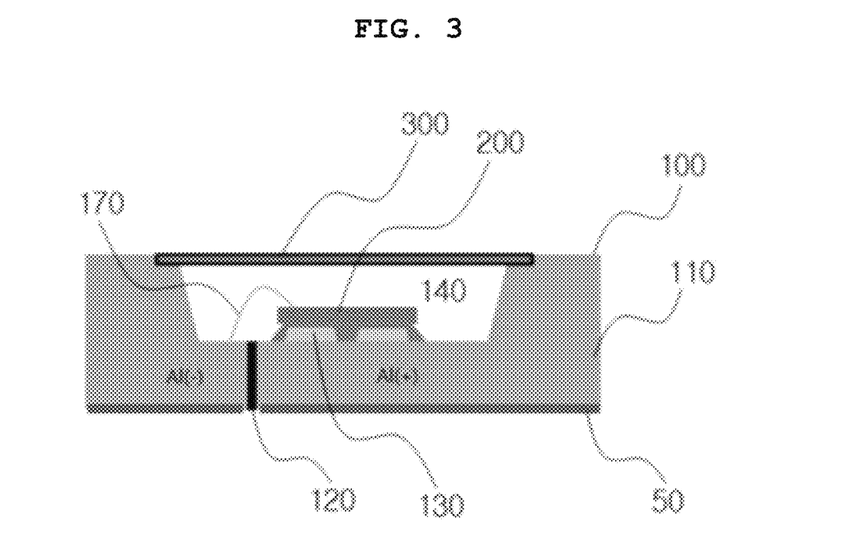
FIGS. 3 and 4 are diagrams illustrating a chip package according to an embodiment of the present invention.

Moreover, referring to FIG. 3 which is a structure for sealing the cavity 140 in which the chip is mounted, in postprocessing. The chip mounting method may further include a step for forming a sealing member 300 to have a shape covering the cavity 140. At this time, the sealing member 300 may be formed of glass, quartz, or silicon.

Also, although a UV flip chip in which the electrode is formed in the bottom was used as an example of the UV chip in description of the chip mounting method, the structure of the present invention may be applied to a package of a UV LED area as well as an LED structure of a visible ray area.

Figure 4:
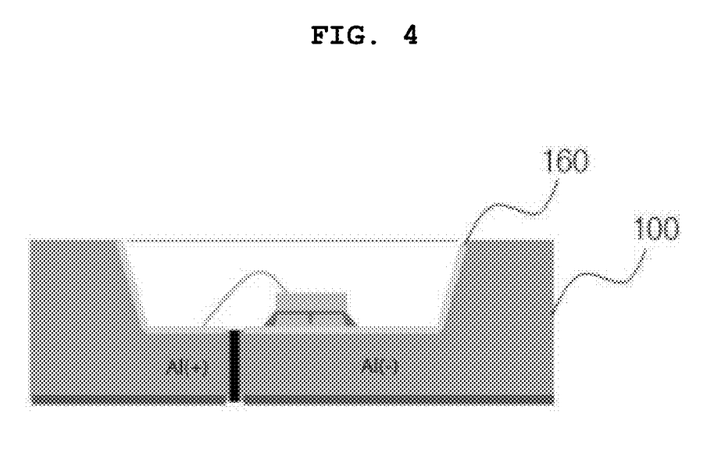

Further, referring to FIG. 4, in the LED structure of the visible light region, a surface of an aluminum substrate may be plated with silver (Ag), and the like in order to improve reflectivity and bondability.

That is, in this embodiment, prior to the bump 130 forming step (S100), the chip mounting method may further include plating the surface of the substrate, and the surface of the substrate may be plated with silver in the coating of the surface of the substrate, and after this, the bumps 130 may be formed on one surface of the plated substrate in the bump forming step (S100).

Hereinafter, referring to FIGS. 2d and 3, a chip package in which the chip is mounted will be described. Referring to FIG. 2d, the chip package according to an embodiment of the present invention may include a substrate 100, a chip 200, bumps 130, and a solder 150.

In this embodiment, the substrate 100 may include: conductive portions 110; and an insulating portion 120 which electrically isolates conductive portions 110 from each other. In this embodiment, the conductive portions 110 may provide an electrode to the chip 200 which is mounted on the substrate 100. That is, the conductive portions 110 may be formed of a conductive material in order to provide an electrode to the chip 200, and the bottom of the conductive portion 110 may be bonded to the substrate in which the electrode is formed to receive voltages from the outside. In this embodiment, the conductive portions 110 may be formed using an aluminum sheet.

The insulating portion 120 may electrically isolate the conductive portions 110 in order to apply voltages to each of the electrode portions 210 of the chip 200. That is, the insulating portion 120 may electrically isolate the conductive portions 110 from each other in order to apply a positive or a negative voltage independently to the chip 200, and each of the isolated conductive portions 110 may receive positive and negative voltages from the outside.

Moreover, in this embodiment, a concave cavity 140 may be formed in the inner direction of the conductive portion 110 of the substrate 100 in order to form a space in which the chip 200 is mounted. That is, referring to FIG. 3, the surface of the substrate 100 may be formed to have a more concave shape than the outer surface. That is, the substrate 100 may have a shape in which an outer wall is formed around a portion in which the chip 200 is mounted. At this time, a shape of the cavity 140 may be formed to have a downwardly narrowing taper in order to reflect emitted light. That is, referring to FIG. 3, the outer wall may be formed to have an inclined shape in the center direction in which the substrate is mounted.

In this embodiment, the bump 130 may be formed to have a predetermined height on one surface of the conductive portion 110 isolated by the insulating portion 120, and be bonded to the electrode portion 210 formed on the chip 200 through the solder. That is, the bump 130 may be formed on the surface of the conductive portion 110, referring to FIG. 3, on one surface of the conductive portion 110 having a larger area.

The bump 130 may preferably be formed of a conductive material in order to apply a voltage applied to the conductive portion 110 to the electrode portion 210 of the chip 200 which is mounted, and it may be the gold stud bump 130 using gold as a material thereof.

Further, in this embodiment, the solder 150 may bond the chip and the bump, and seal the space between the chip and the bump formed by bonding the chip and the bump. That is, the electrode portion 210 and the bump 130 formed on the bottom of the chip 200 may be bonded by a soldering process.

Specifically, in this embodiment, the solder 150 may be formed in a space between the chip 200 formed by bonding the electrode portion 210 of the chip 200 and the bump 130 and the substrate 100 for mounting the chip 200 by the soldering process in order to seal a bonding portion of the chip 200. Accordingly, since cracking due to difference of thermal expansion coefficients between materials of the substrate is prevented, a more reliable package structure can be formed.

In addition, since the bonding portion of the chip 200 is not in contact with air, oxidation of the chip 200 due to the outside air can be prevented. It may not be necessary to process an inner state of the chip 200 in a vacuum state, or process the inner state of the chip 200 in an inert state by filling an inert gas, for example, $N_2$ gas, inside the chip 200.

Further, referring to FIG. 4, in this embodiment, the substrate 100 may further include a plating layer 160. In this embodiment, an example in which the chip 200 disposed in the chip package is the UV chip, i.e., the UV flip chip in which the electrode is formed on the bottom, was described, but the structure of the present invention may be also applied to the UV LED packages as well as the visible light LED structures. That is, for the visible light LED structures, a silver (Ag) or the like plated surface of an aluminum substrate may be used in order to improve reflectivity and bondability. That is, in this embodiment, the bump 130 may be formed on one surface of the plated substrate.

Further, the chip package may further include a sealing member 300 having a shape covering the cavity 140 as a structure for sealing the cavity 140, wherein the chip 200 is mounted, in postprocessing. At this time, the sealing member 300 may be formed of glass, quartz, or silicon.

In the chip package according to an embodiment described above, for a metal substrate wherein a vertical insulating layer is included, since the electrode portion of the chip and the electrode portion of the substrate have to be electrically connected, the metal substrate is bonded to the electrode portion of the chip using the bump additionally formed on the metal substrate, so the heat generated in the chip can be rapidly transferred to the substrate, and the junction temperature of the chip can be decreased, thereby enhancing the light efficiency and the lifespan.

In addition, cracking due to the difference of thermal expansion coefficient between solder materials can be prevented by sealing the bonding portion of the chip using the solder materials. Further, since oxidation of the bonding portion is prevented by blocking the contact with the outside, the chip packaging process can be performed without an additional process of filling an inert gas into the internal space wherein the chip is mounted. The above description is only illustrative of embodiments of the spirit of this invention concept. Those skilled in the art will readily appreciate that many modifications, changes, and alternatives are possible without materially departing from the novel teachings and advantages.

Accordingly, the embodiments and the accompanying drawings disclosed in this specification are intended not to limit the scope of this inventive concept but to describe this inventive concept, and the scope of this inventive concept cannot be limited by the embodiments and the accompanying drawings. The scope of this inventive concept should be construed by the claims, and all concepts within the equivalent scope will be construed as being included in the scope of this inventive concept.

What is claimed is:

1. A chip package, comprising:
   a substrate having a plating layer formed on a surface thereof and including a cavity formed concavely in an inner direction;
   a chip wherein an electrode portion or a metal portion is formed on a bottom of the chip;
   an insulating portion configured to electrically isolate a first conductive portion of the substrate from a second conductive portion of the substrate and wherein the plating layer includes one plated surface of the cavity on the first conductive portion of the substrate and another plated surface of the cavity on the second conductive portion of the substrate electrically isolated from the one plated surface;
   a bump formed on the one plated surface of the cavity; and
   a solder for bonding the chip and the bump by being melted, and sealing a space between the chip and the substrate formed by bonding the chip and the bump,
   and a wire configured to electrically connect the chip and the another plated surface of the cavity on the second conductive portion of the substrate.

2. The chip package according to claim 1, wherein the chip package comprises a plurality of bumps formed with intervals determined based on heat dissipation characteristics of the bump.

3. The chip package according to claim 1, further comprising a sealing member for sealing the chip disposed in the cavity.

* * * * *